(12) United States Patent
Barwicz

(10) Patent No.: US 12,360,312 B2
(45) Date of Patent: Jul. 15, 2025

(54) EVANESCENT COUPLERS AND RELATED METHODS

(71) Applicant: Cisco Technology, Inc., San Jose, CA (US)

(72) Inventor: Tymon Barwicz, Holmdel, NJ (US)

(73) Assignee: Cisco Technology, Inc., San Jose, CA (US)

( * ) Notice: Subject to any disclaimer, the term of this patent is extended or adjusted under 35 U.S.C. 154(b) by 43 days.

(21) Appl. No.: 17/965,568

(22) Filed: Oct. 13, 2022

(65) Prior Publication Data

US 2024/0126010 A1    Apr. 18, 2024

(51) Int. Cl.
| G02B 6/122 | (2006.01) |
| G02B 6/12 | (2006.01) |
| G02B 6/293 | (2006.01) |
| H01S 5/026 | (2006.01) |

(52) U.S. Cl.
CPC ..... *G02B 6/12007* (2013.01); *G02B 6/12004* (2013.01); *G02B 6/1228* (2013.01); *G02B 6/29331* (2013.01); *G02B 2006/12097* (2013.01); *H01S 5/026* (2013.01)

(58) Field of Classification Search
CPC .... G02B 6/1225; G02B 6/1228; G02B 6/125; G02B 2006/12097; G02B 6/29331
See application file for complete search history.

(56) References Cited

U.S. PATENT DOCUMENTS

| 8,411,260 | B1* | 4/2013 | Feng | .................. | G02B 6/132 |
| | | | | | 356/73.1 |
| 9,664,855 | B2* | 5/2017 | Sodagar | .................. | G02B 6/122 |
| 2015/0253501 | A1* | 9/2015 | Li | .................. | H01S 5/141 |
| | | | | | 385/14 |
| 2018/0059329 | A1* | 3/2018 | Boutami | .............. | G02B 6/1228 |
| 2021/0041760 | A1* | 2/2021 | Qiao | ....................... | G02F 1/225 |
| 2025/0035838 | A1* | 1/2025 | Vulovic | ................. | G02B 6/136 |

FOREIGN PATENT DOCUMENTS

| CN | 112886392 | 6/2021 |
| JP | H01219706 | 9/1989 |

OTHER PUBLICATIONS

Enakshi Khular Sharma et al.; "Coupled mode theory and coupled mode photonic devices: A Review"; Asian Journal of Physics; vol. 30; No. 5; (2021); pp. 1-18.
Partial European Search Report; European Patent Application No. 23199664.6; date of mailing Mar. 13, 2024; (31 pages).

* cited by examiner

*Primary Examiner* — Eric Wong
(74) *Attorney, Agent, or Firm* — Patterson + Sheridan, LLP

(57) ABSTRACT

In part, the disclosure relates to an optical coupler. The optical coupler may include two ridge waveguides that include a first waveguide and a second waveguide. One or more segments of the two waveguides extend over a coupling length or other distance. One or more sections of each ridge waveguide is at least partially defined by a set of cross-sectional profiles, a plurality of sections of each ridge waveguide have a width that tapers along a length of the two ridge waveguides. Within the coupling length, a subset of the set of cross-sectional profiles may define a first pair of transition regions and a second pair of transition regions. The coupler may include a coupling region between the two ridge waveguides and spanning at least a section of the coupling length.

21 Claims, 11 Drawing Sheets

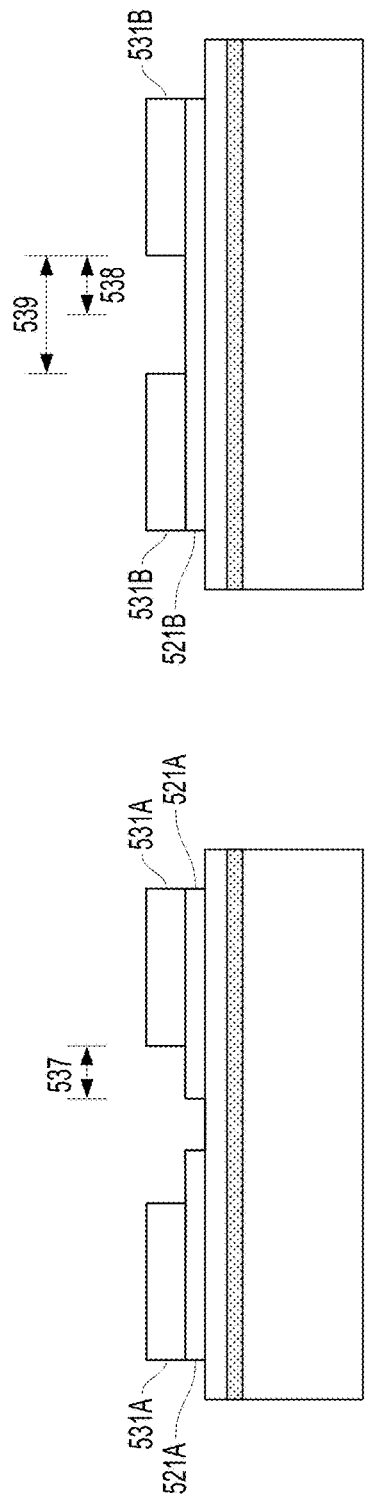
FIG. 5A
FIG. 5B
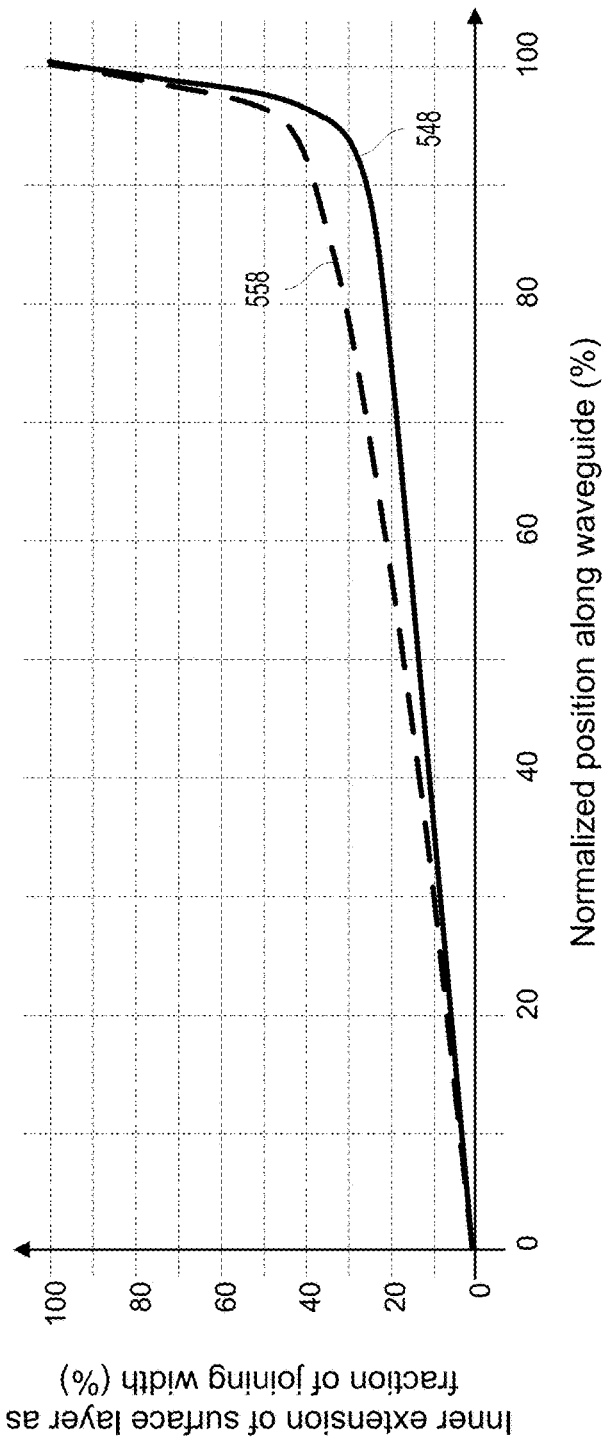
FIG. 5C

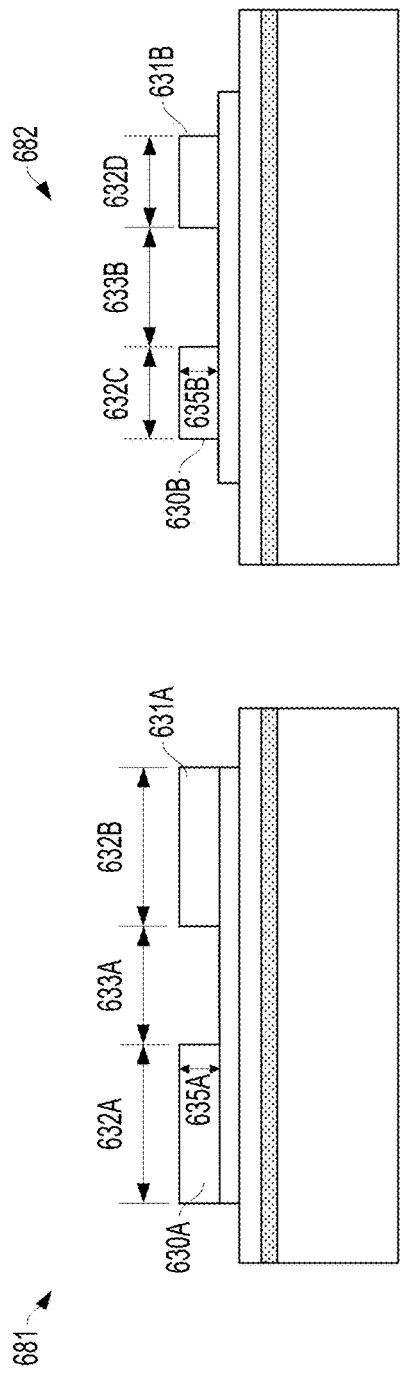
FIG. 6A
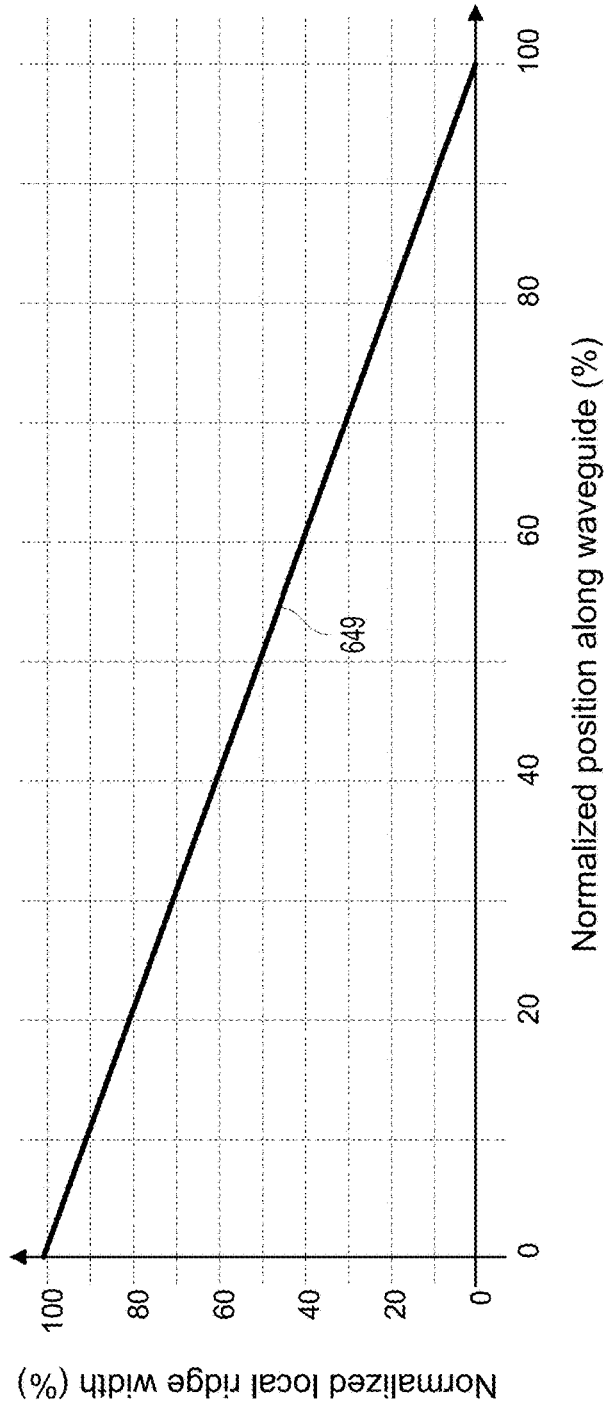
FIG. 6B
FIG. 6C

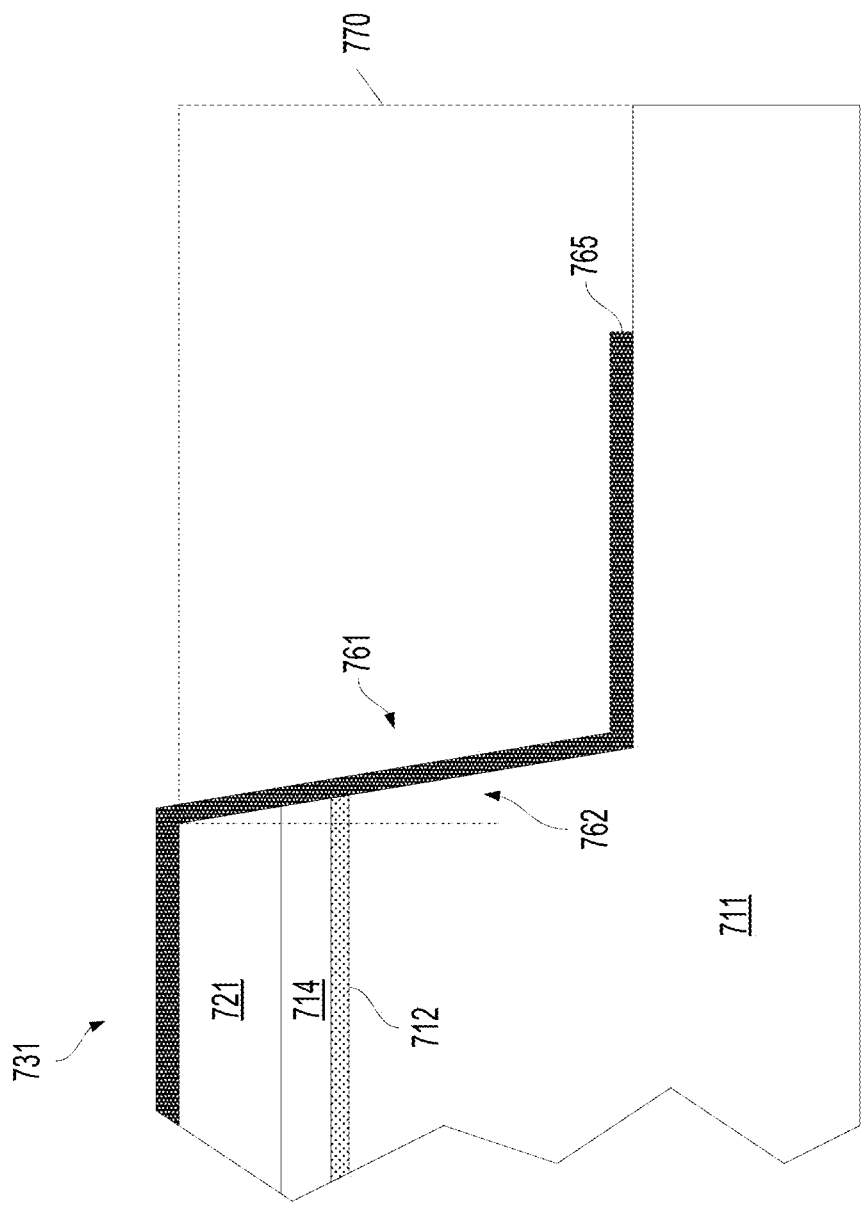

EVANESCENT COUPLERS AND RELATED METHODS

FIELD

This disclosure relates generally to the fields of optical telecommunications, couplers and waveguides.

BACKGROUND

Contemporary telecommunications systems make extensive use of integrated circuits that are advantageously mass-produced in various configurations for various purposes.

SUMMARY

In part, in one aspect, the disclosure relates to a two-layer, two level, or stepped evanescent coupler in a photonic integrated circuit. The power coupling of evanescent couplers is generally sensitive to fabrication tolerances and to the wavelength of operation. Making the power coupling more accurate and more robust is of substantial interest to applications in the field.

Applicant has realized an approach to evanescent coupler device geometry that substantially improves the robustness of power coupling to fabrication tolerances, substantially improves the spectral width on which couplers can accurately function, and substantially reduces the coupling length required to achieve a given power coupling ratio with respect to typical one-layer evanescent coupler device geometries.

Also of interest to applications in the field of optical communications is a 180 degree change of direction, in a narrow footprint, of the path of a waveguide. In particular, low-confinement waveguides, such as typical ridge waveguides, generally require a large radius of curvature in a continuous, 180 degree bend to reverse the direction of the path of the waveguide. The large-radius bend consumes a large area on chip, area which may be especially costly in III-V semiconductor platforms frequently used in photonics.

In part, in one aspect, the disclosure relates to an evanescent coupler device that reverses the direction of the path of a waveguide within a narrow footprint on chip. In various embodiments, to support light in an evanescent coupler propagating into the correct branch of the coupler after a reversal of direction in response to an angled reflector, the coupler is designed with various tapers, transition regions, heights, and widths with a high degree of accuracy.

In part, the disclosure relates to an optical coupler. The optical coupler may include two ridge waveguides that include a first waveguide and a second waveguide. One or more segments of the two waveguides extend over a coupling length or other distance. One or more sections of each ridge waveguide is at least partially defined by a set of cross-sectional profiles, a plurality of sections of each ridge waveguide have a width that tapers along a length of the two ridge waveguides. Within the coupling length, a subset of the set of cross-sectional profiles may define a first pair of transition regions and a second pair of transition regions. The coupler may include a coupling region between the two ridge waveguides and spanning at least a section of the coupling length.

In some embodiments, the first pair of transition regions are a first pair of steps, each first step defined by a first etch depth along an outer or inner surface of each ridge waveguide, wherein the second pair of transition regions are a second pair of steps, each second step defined by a second etch depth along an outer or inner surface of each first step. In various embodiments, the second etch depth is deeper than the first etch depth. In some embodiments, the first pair of transition regions and the second pair of transition regions are symmetrically arranged relative to a plane dividing the coupling region and oriented between the first waveguide and second waveguide.

In many embodiments, the coupler may further include a surface layer, the two waveguides extending above the surface layer, a substrate; and a confinement layer disposed below the two waveguides and above the substrate, wherein the two waveguides are spaced at a predetermined range from each other to couple evanescent waves from the first waveguide to the second waveguide over the coupling region. In some embodiments, the first pair of transition regions and the second pair of transition regions are defined by one or more sections of the surface layer that extend outward from a side surface of each ridge waveguide. In many embodiments, the coupler may further include a shared reflective surface disposed at an end of the coupling region, the shared reflective surface in optical communication with an end of each of the two waveguides and disposed at approximately normal angle to the two waveguides.

In various embodiments, a section of the two waveguides positioned before the coupling region is defined by an adiabatic transition that corresponds to a linear taper in curvature space. In many embodiments, the width and curvature tapers along one or more sections of each waveguide such that the evanescent coupler has a power coupling that ranges between about 40% to about 60%. In some embodiments, the two waveguides are configured to taper in each of their widths and a two-layer ridge evanescent coupler to transition to a one-layer ridge evanescent coupler, wherein a waveguide separation distance is specified by a fixed radius of curvature.

In some embodiments, the two waveguides comprise one or more of: indium phosphide (InP); or gallium arsenide (GaAs). In various embodiments, a section of the two waveguides is configured to adiabatically modulate curvature of one or more layers of coupler as a gap between the two waveguides decreases. In many embodiments, the coupler may further include an input port coupled to the first waveguide; and an output port coupled to the second waveguide.

In part, the disclosure relates to an evanescent coupler. The coupler may include two waveguides that include a first waveguide and a second waveguide, such as for example, an incoming waveguide and an outgoing waveguide, wherein the two waveguides are extended over a coupling length; a coupling region between the two waveguides and spanning the coupling length, wherein the two waveguides are spaced at a predetermined range from each other to couple evanescent waves from the incoming waveguide to the outgoing waveguide over the coupling region; a surface layer for supporting the two waveguides; a confinement layer for providing a vertical confinement of light for the two waveguides; a shared reflector truncating the coupling region of the evanescent coupler at an angle approximately normal to the waveguides; and a substrate, wherein the waveguides are formed in or upon the substrate.

In some embodiments, the reflector includes an etched facet, the etched facet forms an angle with respect to a plane normal to the substrate, the angle being less than about 5 degrees, and the etched facet has a depth that ranges between about 2 to about 10 µm. In some embodiments, the reflector includes a reflective coating, and the reflective coating includes a layer of gold (Au) having a thickness that ranges between about 10 to about 2000 nm. In some embodiments, the coupling region includes one or more width tapers along the section of waveguides in the coupling region.

In many embodiments, power coupling between the two waveguides, from an edge of the evanescent coupler up to the reflector, ranges from about 46% to about 54%. In some embodiments, the two waveguides adiabatically transition from a section that includes a pair of one-layer ridge waveguides to a section that includes a pair of two-layer ridge waveguides. In some embodiments, the reflector includes a plurality of dielectric materials forming a dielectric mirror. In some embodiments, the two waveguides comprise one or more of: silicon (Si); indium phosphide (InP); or gallium arsenide (GaAs).

In part, the disclosure relates to a method for reversing a direction of light propagation in an evanescent coupler. The method may include propagating light through an optical input of an evanescent coupler in optical communication with a first ridge waveguide; transmitting the light through a plurality of sections of a first ridge waveguide, wherein one of the sections of the first ridge waveguide is separated from a second ridge waveguide by a gap such that an optical coupling length is defined; transmitting the light along the optical coupling length, wherein the first ridge waveguide and the second ridge waveguide are spaced at a predetermined range from each other to couple evanescent waves from the first ridge waveguide to the second ridge waveguide over the coupling length to achieve a 40 to 60% power coupling; reflecting light from one or both of the first waveguide and the second waveguide at a single angled reflective surface that terminates the first waveguide and the second waveguide and is optically coupled therewith; continuing the evanescent coupling of the reflected light from the single reflective surface to achieve approximately 100% power coupling into the second ridge waveguide; and transmitting at least a portion of the reflected light from an optical output in optical communication with the second ridge waveguide. In some embodiments, the light has a wavelength between about 1260 nm and about 1650 nm.

Although, the disclosure relates to different aspects and embodiments, it is understood that the different aspects and embodiments disclosed herein can be integrated, combined, or used together as a combination system, or in part, as separate components, devices, and systems, as appropriate. Thus, each embodiment disclosed herein can be incorporated in each of the aspects to varying degrees as appropriate for a given implementation. Further, the various apparatus, optical elements, passivation coatings/layers, etches, optical paths, waveguides, splitters, couplers, combiners, electro-optical devices, inputs, outputs, ports, channels, components and parts of the foregoing disclosed herein can be used with any laser, laser-based communication system, waveguide, fiber, transmitter, transceiver, receiver, and other devices and systems without limitation.

These and other features of the applicant's teachings are set forth herein.

BRIEF DESCRIPTION OF THE FIGURES

Unless specified otherwise, the accompanying drawings illustrate aspects of the innovations described herein. Referring to the drawings, wherein like numerals refer to like parts throughout the several views and this specification, several embodiments of presently disclosed principles are illustrated by way of example, and not by way of limitation. The drawings are not intended to be to scale. A more complete understanding of the disclosure may be realized by reference to the accompanying drawings in which:

FIG. 5A is an illustration of a cross-sectional view of an evanescent coupler where the surface layer is split into two optical branches, according to an exemplary embodiment of the disclosure.

FIG. 5B is an illustration of a cross-sectional view of a two-layer evanescent coupler where the two surface layer branches have just joined, according to an exemplary embodiment of the disclosure.

FIG. 5C is a plot illustrating the taper of the widths of the branches of the surface layer as the waveguides gradually transition, according to an exemplary embodiment of the disclosure.

FIG. 6A is an illustration of a cross-sectional view of an evanescent coupler corresponding to an initial cross-section, according to an exemplary embodiment of the disclosure.

FIG. 6B is an illustration of a cross-sectional view of an evanescent coupler corresponding to a final cross-section, according to an exemplary embodiment of the disclosure.

FIG. 6C is a plot of the linear taper of the widths of the waveguides between the initial and final cross sections according to an exemplary embodiment of the disclosure.

FIG. 7 is a side-view illustration of an etched-facet reflector in an evanescent coupler, according to an exemplary embodiment of the disclosure.

DETAILED DESCRIPTION

Figure 1:
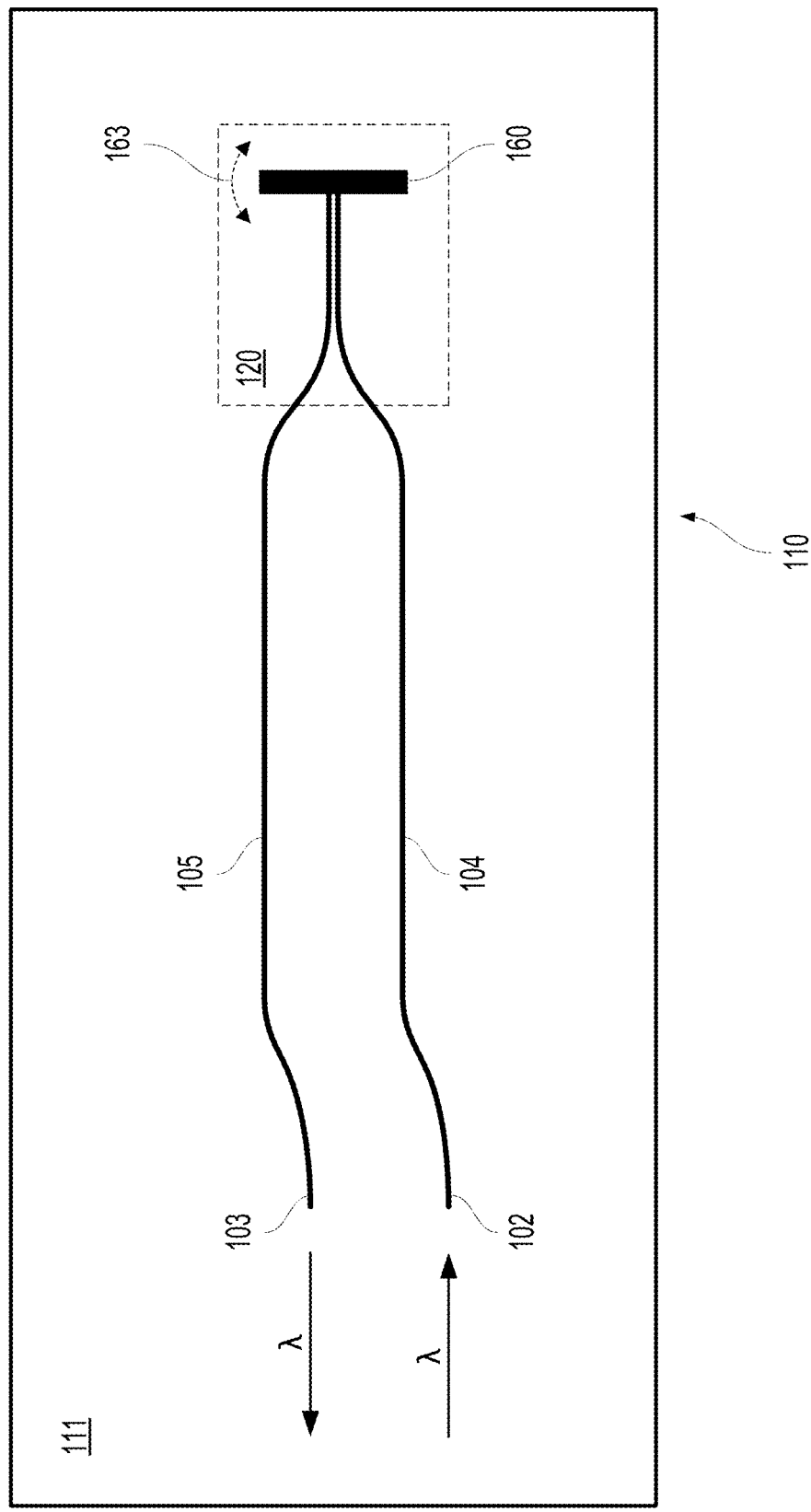
FIG. 1 is an illustration of a top-down view of an evanescent coupler configuration that includes components for reversal of light direction or general light coupling, according to an exemplary embodiment of the disclosure.

An evanescent coupler may include waveguides positioned sufficiently close to one another such that an evanescent wave from one waveguide couples into the other waveguide. In various embodiments, the disclosure relates to waveguides such as channel or ridge waveguides that are curved, tapered, straight, and disposed relative to air trenches or gaps between the waveguides. In various embodiments, substantially straight or linear waveguide sections may be coupled by curved or tapered transitional waveguide sections. The air tapers, curves, trenches and gaps may be formed by various etching-based fabrication techniques. In some embodiments, the waveguides are curved or straight waveguides or combinations of both with various sections such as curved, straighten, tapered, and other geometries along different sections of the waveguide. In some embodiments, a ridge waveguide is surrounded by air trenches or air gaps or low-index materials to confine optical signals within a wave propagating region within the ridge. In some embodiments, a pair of ridge waveguides may be used in a two layer or multilayer evanescent coupler that includes an inner gap in between the ridge waveguides and one or more steps or transitional regions extending outward from the outer surface of each ridge waveguide. In various embodiments, the formation of pairs of steps, transitional regions, fenders, bumpers, or other structures on either side of the coupler near the outer surface of each waveguide may improve power coupling stability with wavelength of operation and fabrication tolerances.

In part, the disclosures relates to different waveguide and coupler configurations. In some embodiments, an evanescent coupler may be formed that includes two ridge waveguides that extend a certain common length, called the coupling length, over which the waveguides are within sufficient distance of one another so as to be able to couple an evanescent wave from one waveguide into the other waveguide. In many embodiments, the waveguides and couplers disclosed herein may be used with steps or transition regions formed through one or more etches or other processes as part of a multi-layer evanescent coupler design. In some embodiments, the devices disclosed herein may be used with photonic integrated circuits (PICs) and various optical and optoelectronic telecommunication devices.

In some embodiments, the current disclosure relates to a coupler that uses a single reflector to provide a return path for light to reflect or otherwise couple into a separate waveguide. In various embodiments, the reversal of light direction occurs within a small area of a multi-layer structure, e.g. not requiring waveguide bends with large radius of curvature. In some aspects, the reflector includes a plurality of dielectric materials forming a dielectric mirror. In one aspect, the reflector is formed by an etching of waveguides followed by a deposition of a reflective coating.

In some embodiments, various waveguides segments and/or a coupling region of an evanescent coupler may include one or more width tapers or adiabatic curvature changes in one or two waveguides. For example, waveguides may be angled toward one another, tapered in width, and/or transitioned adiabatically in curvature to approach one another in a configuration sufficient to couple an evanescent wave over a coupling length and/or terminate at a single reflector. The one or more width tapers reduces power loss during a coupling of an evanescent wave from the incoming waveguide to the outgoing waveguide. For example, the design of the coupling region may exhibit low differential loss between the fundamental mode and the first order mode of a given polarization. In at least one embodiment, the one or more width tapers may form a transition of the evanescent coupler from a two-layer ridge evanescent coupler to a one-layer ridge evanescent coupler and vice-versa.

In some aspects, one or more width tapers and straight sections cause the evanescent coupler to have a power coupling of between about 40% to about 60%. For example, various embodiments of the disclosure relate to an evanescent coupler that includes ridge waveguide that have a variable separation distance along the length of the coupler from the input and output ports continuing on to both ridge waveguides being in optical communication with a single reflector. In various embodiments, the coupling length may be selected for approximately 50% power coupling, e.g. the input power from one branch is equally distributed at the output over the two branches of the coupler. For example, the coupling length may range from about 25 to about 1000 um. The foregoing coupling length of a two-layer evanescent coupler is reduced by a factor of about 3 to about 10 when compared to an equivalent single-layer ridge waveguide coupler. In some embodiments, a two-layer or stepped ridge waveguide design, as described in the present disclosure, may reduce the uncertainty in the power coupling induced by fabrication and wavelength offsets by up to a factor of 10 (e.g. 50±20% power coupling may be reduced to 50±2% power coupling). In some embodiments, the improvement in power coupling uncertainty is of a factor of about 5 (e.g. 50±10% power coupling may be reduced to 50±2% power coupling).

Furthermore, various embodiments of the disclosure describe a method for reversing a direction of light propagation in an evanescent coupler. The method may include propagating a light through one or more evanescent couplers described herein. The light may have a wavelength between about 1260 and about 1650 nm.

In some embodiments, one or more components of the evanescent coupler may cause a reversal or change in the propagation direction of the light. An example evanescent coupler may include two waveguides that include an incoming waveguide and an outgoing waveguide extended over a coupling length; a coupling region between the two waveguides and spanning the coupling length; and a reflector truncating the coupling region of the evanescent coupler. The two waveguides may be spaced at a predetermined range from each other to couple evanescent waves from the incoming waveguide to the outgoing waveguide over the coupling region. Furthermore, the coupling region may include one or more width tapers or adiabatic curvature transformations in one or both waveguides.

Refer now to the exemplary embodiment of FIG. 1 that illustrates a top-down view of an evanescent coupler 110, according to an exemplary embodiment of the disclosure. As shown in FIG. 1, the coupler 110 may include a substrate 111, an incoming waveguide 104, an outgoing waveguide 105 positioned to operate in the reverse direction to the incoming waveguide, and a coupling region 120 terminated by a reflector 160. The substrate 111, the coupler 110 or other components shown and described herein may be part of a PIC or other device in various embodiments. In various embodiments, the substrate 111 may include one or more layers. The optical waveguides 104, 105 and the structures and cross-sectional profiles thereof may undergo various geometric changes such as with regard to tapering, steps, transitional regions, radius of curvature, separation distances, and relative height of ridge wave guides relative to an upper surface of the substrate 110 and other layers etched or otherwise formed relative to the substrate or ridge guides.

The coupler may have a power coupling of a typical range of 40% to 60% (e.g., between around 46% to 54%). The reflector 160 may be positioned at an angle 163 from the direction normal to the direction of the waveguides. The angle 163 may be selected such that the difference in optical path length between the incoming and outgoing waveguides is not larger than ±π/8 of the optical phase, and preferably less than ±π/16 (e.g., less than about ±π/32) of the optical phase. The coupler 110 may be integrated on or with another device, component, or substrate providing an inlet/input 102 to, and an outlet/output 103 from, the coupler 110. In various embodiments, the coupler may be implemented on or as part of a PIC.

Figure 2:
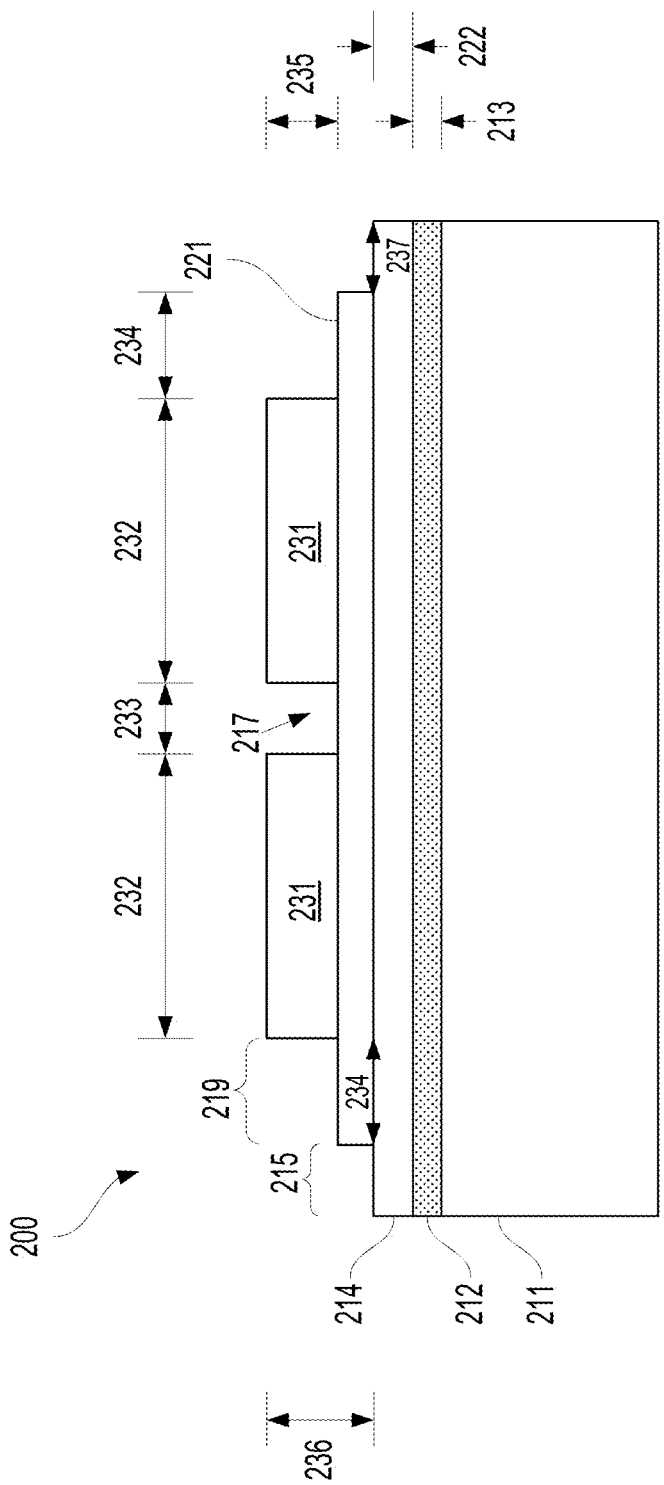
FIG. 2 is an illustration of a cross-sectional view of an evanescent coupler that includes a substrate, confinement layer, surface layer, and ridge waveguides, according to an exemplary embodiment of the disclosure.

Refer now to the exemplary embodiment of FIG. 2 illustrating a cross section in a plane through the coupling region of a two-layer ridge waveguide evanescent coupler 200. As shown in FIG. 2, the two-layer evanescent coupler may include a substrate 211, a confinement layer 212, a surface layer 221, and ridge waveguides 231. For some cross-sectional profiles, the width of the surface layer 221 is less than the width of the upper layer 214. This difference in width is a design choice and allows surface layer 221 to be inset from the edges of the substrate 211 to define a pair of first steps or transition regions 215 on one side of each of the two ridge wave guides 231.

In various embodiments, the height of a first step or first transition region 215 may be defined by the surface layer 221. In various embodiments, transition region 215 may be defined in the vertical direction by a full etch depth. A gap or trough region 217 is also defined by the two inner sides of the ridge wave guides 231. In some embodiments, a second step or second transition region 219 may also be defined by the outer side surface of a ridge waveguide 231 and surface layer 221 with the height of the transition region corresponding to the height of the waveguide 231. The first transition region 215 and the second transition region may be defined in terms of different lengths. A pair of second steps or second transition regions 219 is shown to the left and right of the outer side surface of the ridge waveguides 231. The height of region 219 may be defined by a partial etch that is a fraction of the distance of full etch depth. The second transition region 219 may also be described as an outer extension having a length 234.

The surface layer 221 may include a certain distance 234 padding the edges of the waveguides corresponding to outer extension/second transition region 219. In various embodiments, the distance 234 may range from between about 0.5 μm to about 5 μm. In other embodiments, the distance 234 may range from between about 1 μm to about 3 μm. The first transition region 215 may also include a certain edge distance 237 corresponding to the surface layer 221 being inset from the edge of the upper layer 214. In some embodiments, this edge distance can be of at least 5 um.

In various embodiments, the substrate 211 may contain, for example, silicon (Si), indium phosphide (InP), or gallium arsenide (GaAs). The confinement layer 212 may contain, for example, silicon dioxide ($SiO_2$), aluminum gallium indium arsenide (AlGaInAs), or indium gallium arsenide phosphide (InGaAsP), The surface layer 221 may be contain, for example, Si, InP, or GaAs, and a pair of waveguides 231 may contain, for example, Si, InP, or GaAs. The confinement layer 212 may facilitate a vertical confinement of light and can be a low-index dielectric layer for a Si ridge, a high dielectric layer for a dielectric waveguide or at least one quantum well for a compound semiconductor waveguide wherein a compound semiconductor is a material made of more than one element such as InP, GaAs, InGaAs, AlGaInAs. The confinement layer 212 may include a certain depth 222 from the base of the waveguide between around 50 nm to 1000 nm, and a certain thickness 213 between around 10 to 300 nm. In some embodiments, an upper substrate layer 214 may be disposed above the confinement layer 212. In various embodiments, this upper layer 214 may be the same material as substrate 211 and may be an extension of substrate 211. In other embodiments, the upper layer 214 can contain InAlAs.

In various embodiments, the waveguides, surface layer, steps, and other structures may be produced by additive or subtractive fabrication processes such as etching, deposition, and others. In some embodiments, the height of the ridge waveguides 231 have a combined height 236 of between around 0.5 to 3 μm or between around 1 to 2 μm. In some embodiments, the distances 234 correspond to the width of the second step or second transition region 219. The waveguides 231 may include a certain height 235 above the surface layer 221 between about 50 to about 85% of the combined height 236 or between about 65 to 85% of the combined height 236, a certain width 232 between about 1 to 6 μm or between about 1 to 3 μm, a certain separation distance 233 between about 0.25 to 5 μm or between about 1 to 2 μm. In many embodiments, multiple additional layers may be present, including additional semiconductor layers, dielectric passivation layers, and metallization layers. In various embodiments, in the cross-sectional view show, the first step/first transition region 215 steps up to the second step/second transition region 219 on both sides of the coupler 200. In some embodiments, the dimensions of each pair of steps 219 are substantially the same. In some embodiments, the steps or transition regions may be in the gap 217.

Figure 3A:
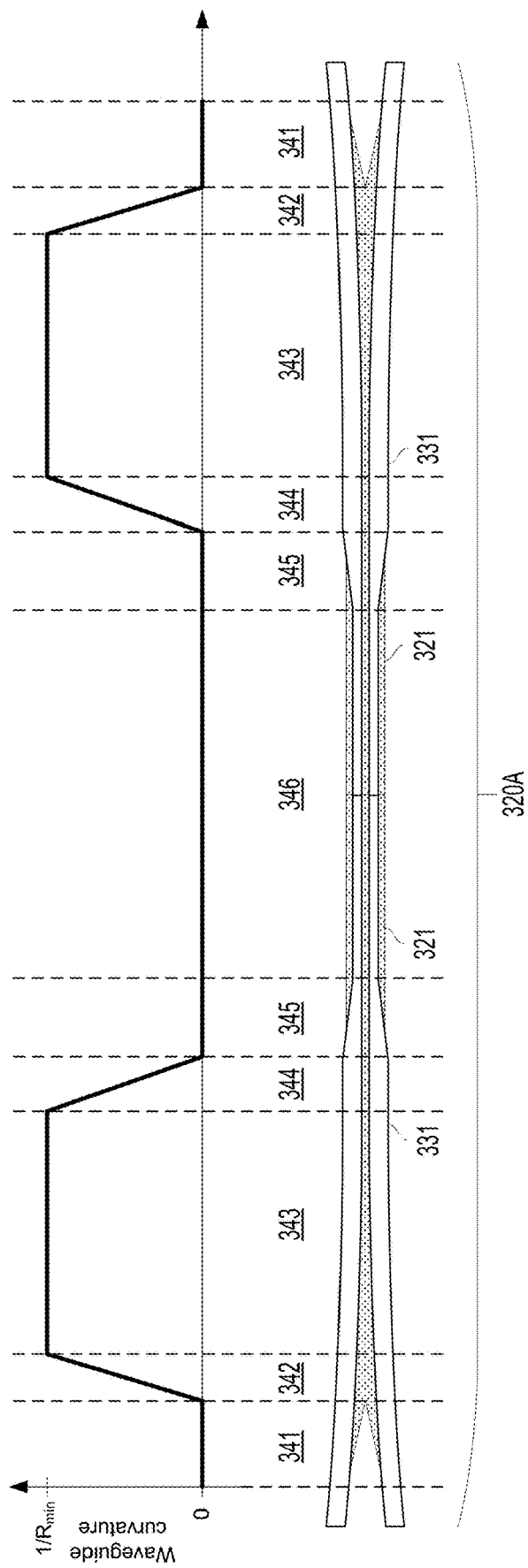
FIG. 3A is an illustration of an evanescent coupler that includes ridge waveguides, a surface layer, and various adiabatic transitions in curvature and tapers of width of the waveguides and surface layer, as well as a plot of waveguide curvature versus normalized waveguide position, according to an exemplary embodiment of the disclosure.

Refer now to the exemplary embodiment of FIG. 3A, illustrating a top-down view of the waveguide optical paths 320 of a two-layer evanescent coupler (e.g., two-layer ridge waveguide evanescent coupler), alongside a plot of waveguide curvature versus normalized waveguide position, according to an exemplary embodiment of the disclosure. As shown in FIG. 3A, the two-layer evanescent coupler may comprise ridge waveguides 331, a surface layer 321, and various adiabatic transitions in curvature and tapers of width of the waveguides 331 and surface layer 321.

In some embodiments, the region of the coupler defining the optical path of the waveguides 320A includes various tapers and adiabatic transitions of curvature of the waveguides 331 and surface layer 321 that bring the waveguides into close proximity where an evanescent wave may be coupled from one waveguide into another. In some embodiments, the coupler includes a region 341 where the surface layer is tapered beneath angled but straight waveguides, a region 342 wherein straight but angled waveguides transition adiabatically in curvature to some finite radius of curvature, a region 343 wherein waveguides exhibit a constant radius of curvature, a region 344 wherein curved waveguides transition adiabatically to straight and parallel waveguides, a region 345 wherein waveguide widths are tapered, and finally a region 346 wherein waveguides are straight, parallel, and of constant width.

Figure 3B:
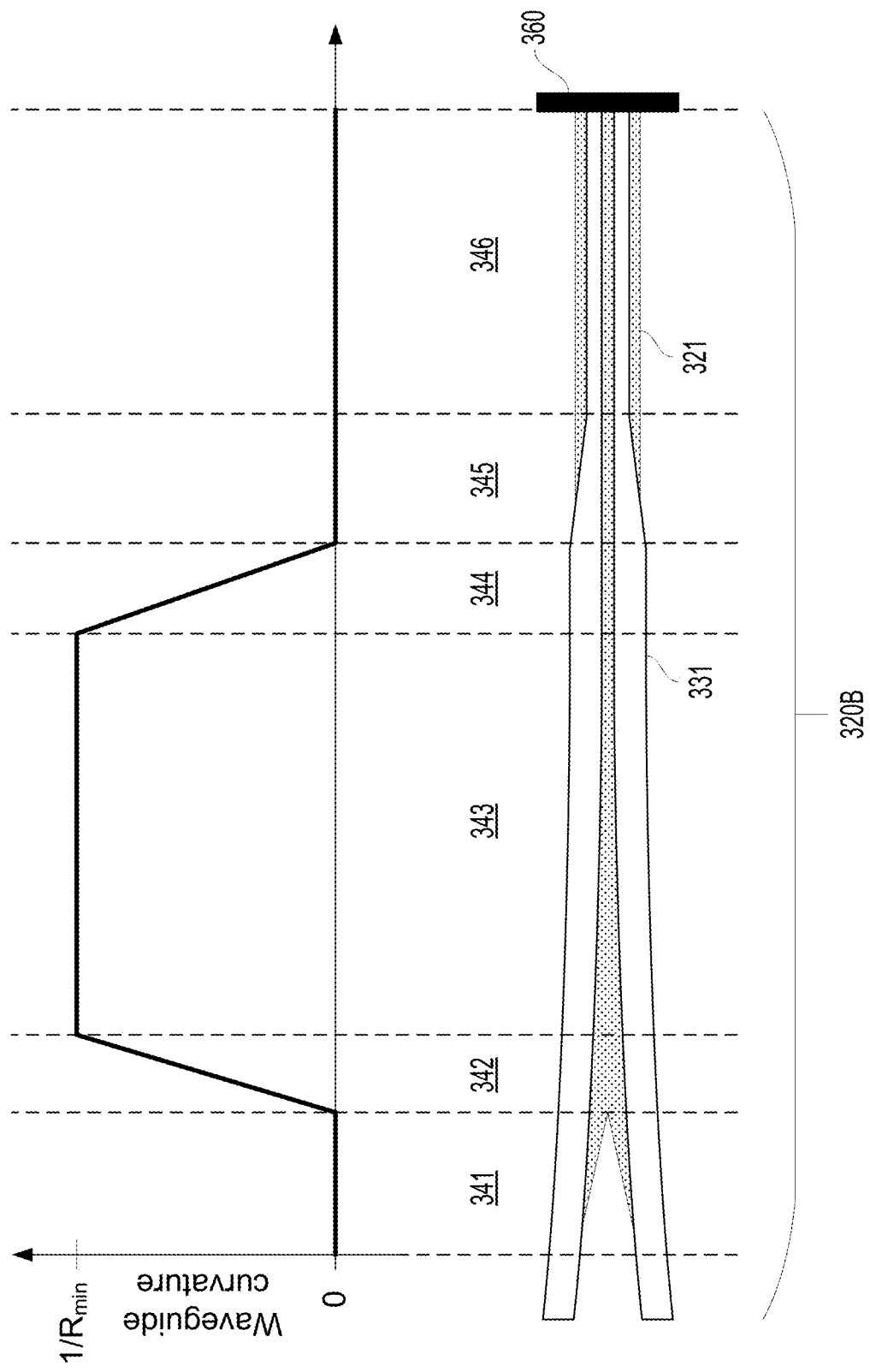
FIG. 3B is an evanescent coupler configured for reversal of light direction with the inclusion of a reflector and two-layer ridge waveguides according to an exemplary embodiment of the disclosure.

Refer now to the exemplary embodiment of FIG. 3B, depicting a two-layer evanescent coupler similar to that of FIG. 3A but wherein the optical paths 320B are truncated and terminated with a reflector 360 so as to reverse the direction of incident light through the coupler. In the embodiment of FIG. 3B, a particular coupling ratio of approximately 50% is achieved in the coupler by a propagating wave just prior to the reflector and a coupling ratio of approximately 100% is achieved after a reflected wave exits the opposite waveguide.

Figure 4A:
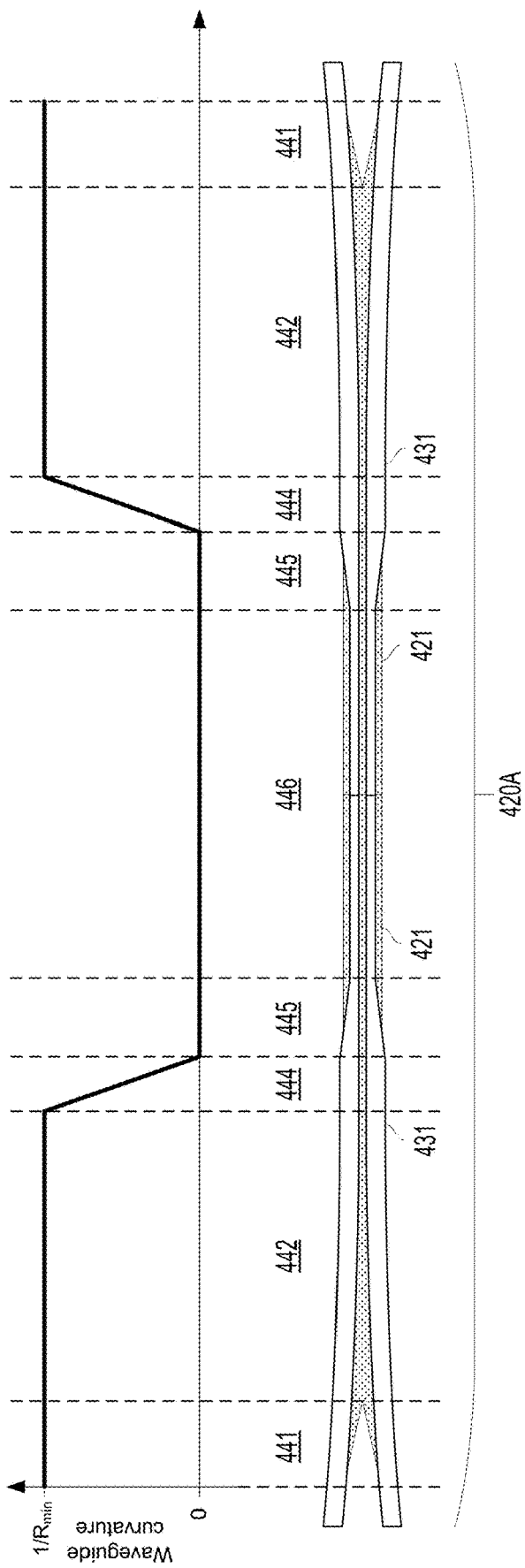
FIG. 4A is an illustration of an alternate design of an evanescent coupler that includes ridge waveguides, a surface layer, and various adiabatic transitions in curvature and tapers of width of the waveguides and surface layer, as well as a plot of waveguide curvature versus normalized waveguide position, according to an exemplary embodiment of the disclosure.

Refer now to the exemplary embodiment of FIG. 4A, wherein an alternate topology of the waveguide transformation towards a two-layer evanescent coupler 420A is shown alongside a plot of waveguide curvature versus normalized waveguide position is illustrated. As shown in FIG. 4, the two-layer evanescent coupler (e.g., two-layer ridge waveguide evanescent coupler) includes ridge waveguides 431, a surface layer 421, and various adiabatic transitions in curvature and tapers of width of the waveguides and surface layer. In some embodiments, for example, in the alternative topology shown in FIG. 4, the coupling region 420A includes a region 441 wherein the surface layer is tapered beneath a curved waveguide, i.e. waveguides having some finite radius of curvature. In some embodiments, the coupling region further includes a region 442 wherein waveguides hold a fixed radius of curvature. In some embodiments, the coupling region further includes regions 444, 445, and 446 where waveguides transition adiabatically from having a curved shape to being straight and parallel, where the waveguides' top-ridge widths are tapered linearly, and where the waveguides are straight, parallel, and of constant width, respectively.

Figure 4B:
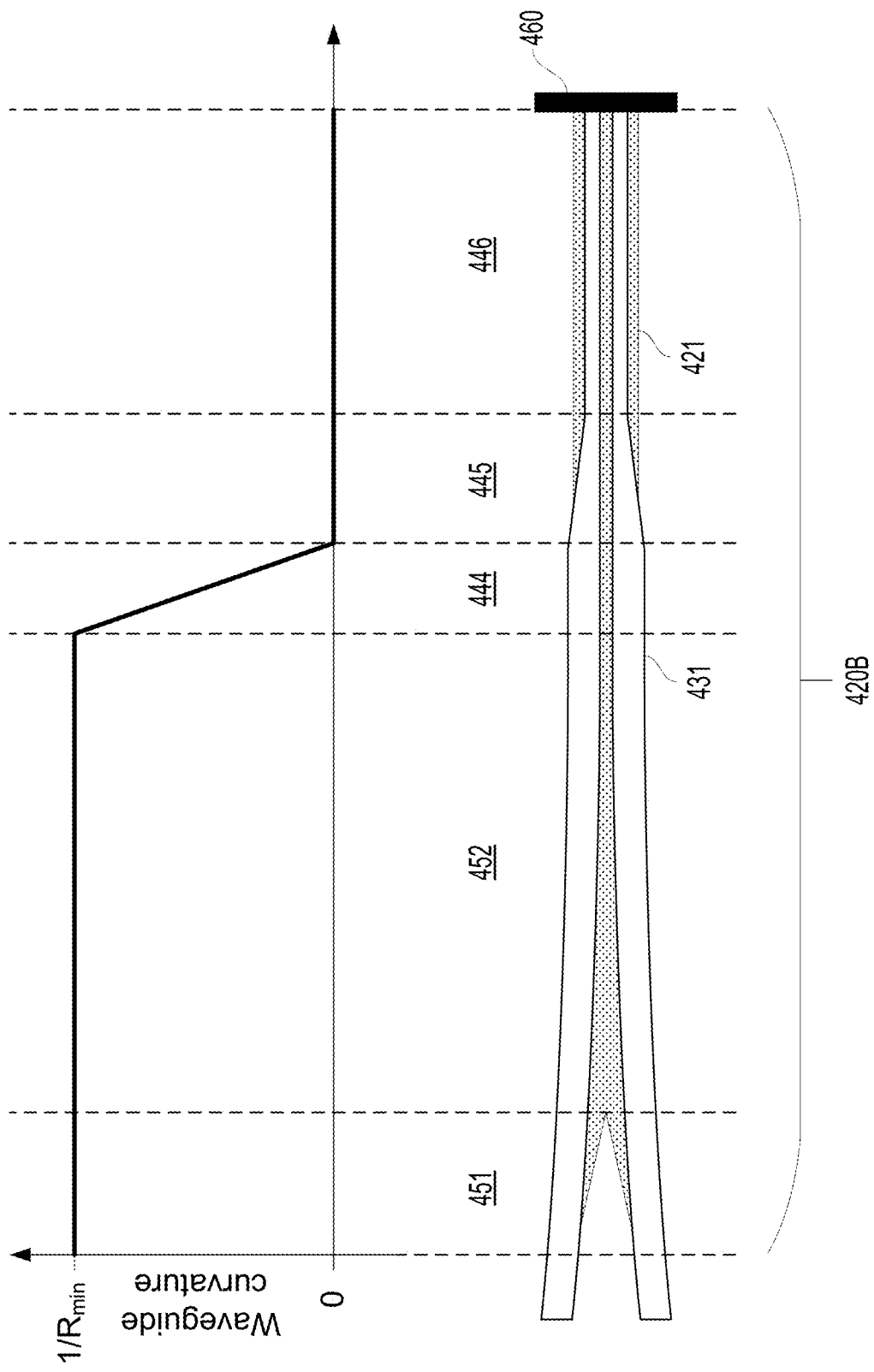
FIG. 4B is an illustration of an alternate design of an evanescent coupler configured for reversal of light direction with the inclusion of a reflector according to an exemplary embodiment of the disclosure.

Refer now to the exemplary embodiment of FIG. 4B, depicting a two-layer evanescent coupler similar to that of FIG. 4A but wherein the optical paths 420B are truncated and terminated with a reflector 460 so as to reverse the direction of incident light through the coupler. In the embodiment of FIG. 4B, a particular coupling ratio of approximately 50% is achieved in the coupler by a propagating wave just prior to the reflector and a coupling ratio of approximately 100% is achieved after a reflected wave exits the opposite waveguide.

Refer now to the exemplary embodiment of FIG. 5A a cross-sectional view of a two-layer evanescent coupler (e.g., two-layer ridge waveguide evanescent coupler) is illustrated wherein the surface layer 521A is split into two branches, according to an exemplary embodiment of the disclosure. As shown in FIG. 5A, the widths of the two branches are tapered. Furthermore, the tapering may include an inner extension 537 of a branch past the edge of a waveguide 531A.

Refer now to the exemplary embodiment of FIG. 5B that illustrates a cross-sectional view of a two-layer evanescent coupler (e.g., a two-layer ridge waveguide evanescent coupler) where the two branches of a surface layer 521B have just joined, according to an exemplary embodiment of the disclosure. As shown in FIG. 5B, the joining width 538 past the edge of a waveguide 531B may be half the gap 539 between the waveguides 531B. The joining width 538 may include having a range typically between about 1 to 10 μm (e.g., between about 2 to 5 μm).

Refer now to the exemplary embodiment of FIG. 5C that illustrates the taper of the widths of the branches of the surface layer as the waveguides are gradually transformed, according to an exemplary embodiment of the disclosure. As shown in FIG. 5C, the taper of the surface layer in the coupling region may include a plot of the ratio of the inner extension of the surface layer to the joining width versus a normalized position along the waveguides bounding the exposed surface layer. In some embodiments, the surface layer is tapered at a particular rate 548 along straight but angled waveguides. Approximate percentages of inner extension to joining width at this rate are tabulated below.

| Position (%) | Full range (%) | Preferred range (%) |
|---|---|---|
| 0 | 0 | 0 |
| 50 | 10-40 | 10-20 |
| 90 | 15-60 | 15-35 |
| 100 | 100 | 100 |

In other embodiments, the surface layer is tapered at some other rate 558 along curved waveguides. Approximate percentages of inner extension to joining width at this rate are tabulated below.

| Position (%) | Full range (%) | Preferred range (%) |
|---|---|---|
| 0 | 0 | 0 |
| 50 | 10-40 | 10-25 |
| 90 | 20-70 | 30-50 |
| 100 | 100 | 100 |

Refer now to the exemplary embodiment of FIG. 6A that depicts a cross-sectional view of a two-layer evanescent coupler (e.g., two-layer ridge waveguide evanescent coupler) 681 that shows two waveguides 630A, 631A. In FIG. 6A, the coupler 681 shows waveguides' widths 632A, 632B, gap 633A, and depth 635A at an initial position, i.e. at a normalized position of 0% along the waveguide, in the width taper. Refer now to the exemplary embodiment of FIG. 6B that depicts a cross-sectional view of a two-layer evanescent coupler (e.g., two-layer ridge waveguide evanescent coupler) 682 that shows two waveguides 630B, 631B. In FIG. 6B, the coupler 682 has tapered waveguide widths 632C, 632D along with waveguide gap 633B and depth 635B. In FIG. 6B, the coupler 682 is shown with the depicted cross section at a final position, i.e. at a normalized position of 100% along the waveguide. In some embodiments, this represents the top width of a ridge waveguide. In a two-layer ridge waveguide, the width of the surface layer remains constant once the outer edges of the ridge waveguides reach the outer edges of the target surface layer extent. In various embodiments, the different waveguide widths 632A, 632B, 632C, and 632D may be substantially the same, some may be different or they all may be different. In various embodiments, the different gaps 633A and 633B may be substantially the same or different. In various embodiments, the different depths 631A and 631B may be substantially the same or different. In some embodiments, 633A and 633B are substantially the same, 632A and 632B are substantially the same, 632C and 632D are substantially the same, and 635A and 635B are substantially the same while 632A and 632B are substantially different from 632C and 632D.

Refer now to the exemplary embodiment of FIG. 6C that illustrates the linear taper of the waveguides' widths. In some embodiments the region of the taper of the waveguides' widths is illustrated by a plot 649 of the normalized local waveguide width versus normalized position along the waveguide. As shown in plot 649, the taper is substantially linear. Approximate percentages of normalized local ridge width at particular normalized positions along the taper are tabulated below.

| Position (%) | Full range (%) |
|---|---|
| 0 | 0 |
| 30 | 20-40 |

| Position (%) | Full range (%) |
|---|---|
| 70 | 60-80 |
| 100 | 100 |

Refer now to the exemplary embodiment of FIG. 7, illustrating a cross section in a plane through the reflector of a two-layer ridge waveguide evanescent coupler. In various embodiments, an etched reflector may be used in the two-layer evanescent coupler (e.g., a two-layer ridge waveguide evanescent coupler). As shown in FIG. 7, the reflector includes a substrate 711, a ridge waveguide 731, a surface layer 721, an upper layer 714, a confinement layer 712, a facet 761 forming an angle 762 with respect to a plane normal to the substrate 711 and normal to the cross-sectional plane, and a reflective coating 765 covering the facet. The facet 761 is characterized by a depth 770 that may range from between about 2 to about 10 μm or between about 3 to 6 μm. In some embodiments, the depth 770 is about 4 μm. The facet angle 762 is within about 5 degrees from the vertical, or within about 2 degrees from the vertical, or within about 1 degree from the vertical. The reflective coating 765 includes a layer of gold or another reflective material having a thickness between about 10 to 2000 nm or between about 100 and 500 nm and includes a plurality of dielectric materials, i.e. optically transparent materials with high bandgap and low carrier mobility such as $SiO_2$, $Si_3N_4$, or SiON, with thicknesses between about 50 to 750 nm or between about 100 to 500 nm.

In various embodiments, it has been found that a reflector can truncate the evanescent coupler with one reflective surface shared by both optical waveguides defining the evanescent couplers without a need for separation of the waveguide and the use of two reflectors. This has a significant advantage as it reduces the possibility of optical path imbalance between the two separated waveguide branches prior to the reflector. Such imbalance can be due to fabrication imperfections and thermal gradients on the photonic die and dramatically impacts the accuracy of the direction reversal of light. By truncating in the coupler without waveguide separation we substantially improve robustness to fabrication errors, thermal gradients, and angular misalignment of the reflector.

Figure 8:
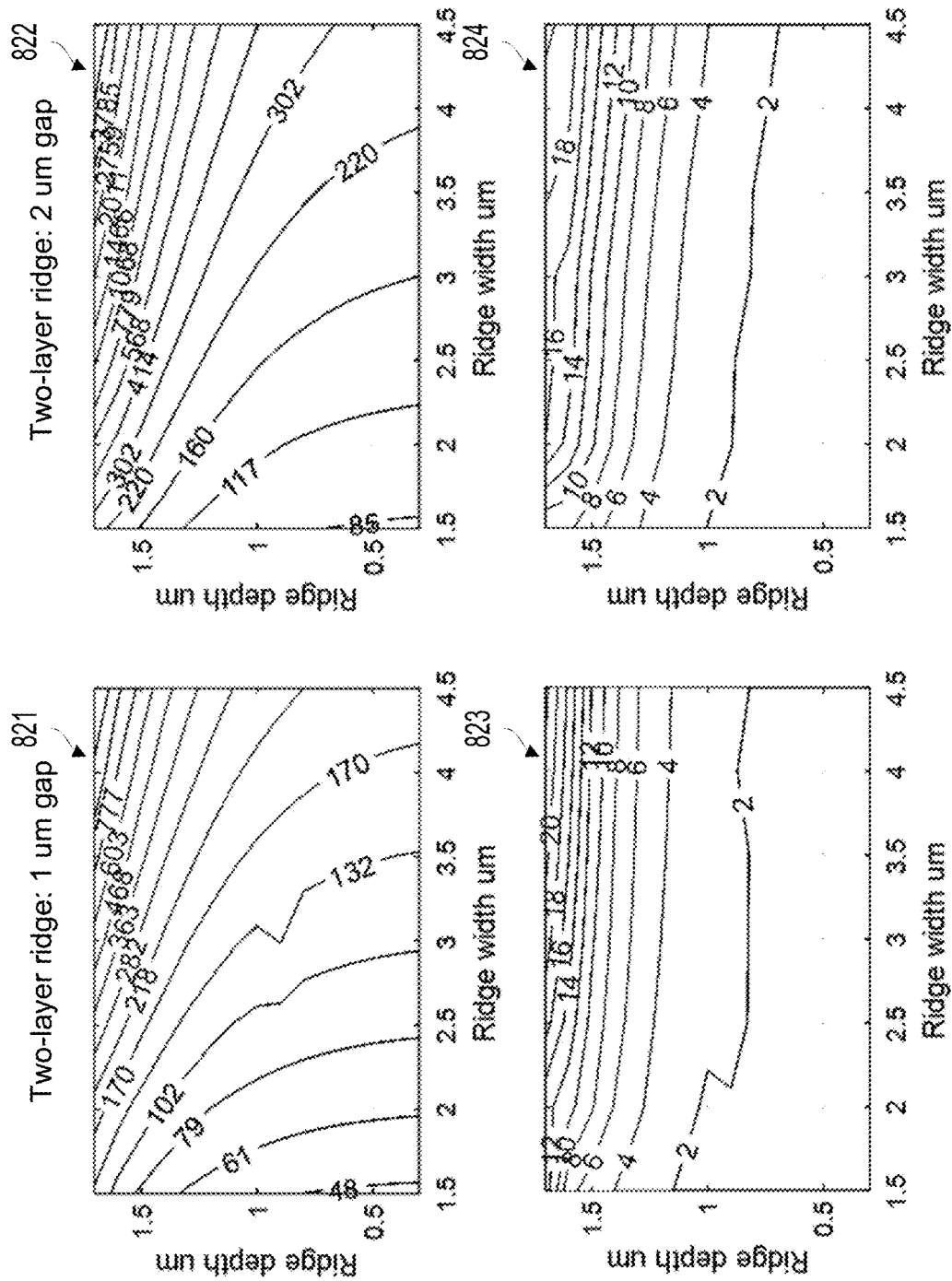
FIG. 8 is a contour map of the coupling length of a two-layer/two level evanescent coupler as a function of ridge waveguide geometry, according to an exemplary embodiment of the disclosure.

Refer also to the exemplary embodiment of FIG. 8 wherein equivalent contour maps are illustrated for the case of a two layer or stepped ridge waveguide evanescent coupler as a function of ridge waveguide geometry. For example, a map may indicate the coupling length of a coupler of the present disclosure where the surface layer thickness is nonzero or where the ridge waveguide height includes a fraction less than unity of the combined height. A map may indicate the coupling length of a coupler with waveguides separated by a gap of 1 μm 821 or 2 μm 822. As shown, a two-layer ridge waveguide evanescent coupler may require a shorter coupling length to achieve 50% power coupling and may demonstrate lower expected offsets in power coupling than the one-layer ridge waveguide evanescent coupler.

FIG. 8 also illustrates a contour map of an expected offset in power coupling of a two-layer evanescent coupler due to variations in ridge waveguide geometry, in the cases of a waveguide gap of 1 μm 823 or 2 μm 824. As shown in FIG. 8, such as by the relative closeness and flatness of the contour lines in the bottom two plots showing expected offset on percentage of power coupling, a two-layer ridge waveguide evanescent coupler may achieve a substantially lower expected offset in power coupling percentage in contrast with other designs, such as single layer designs. In various embodiments, a two-layer evanescent coupler has much improved performance with reduced susceptibility to manufacturing variation.

Figure 9:
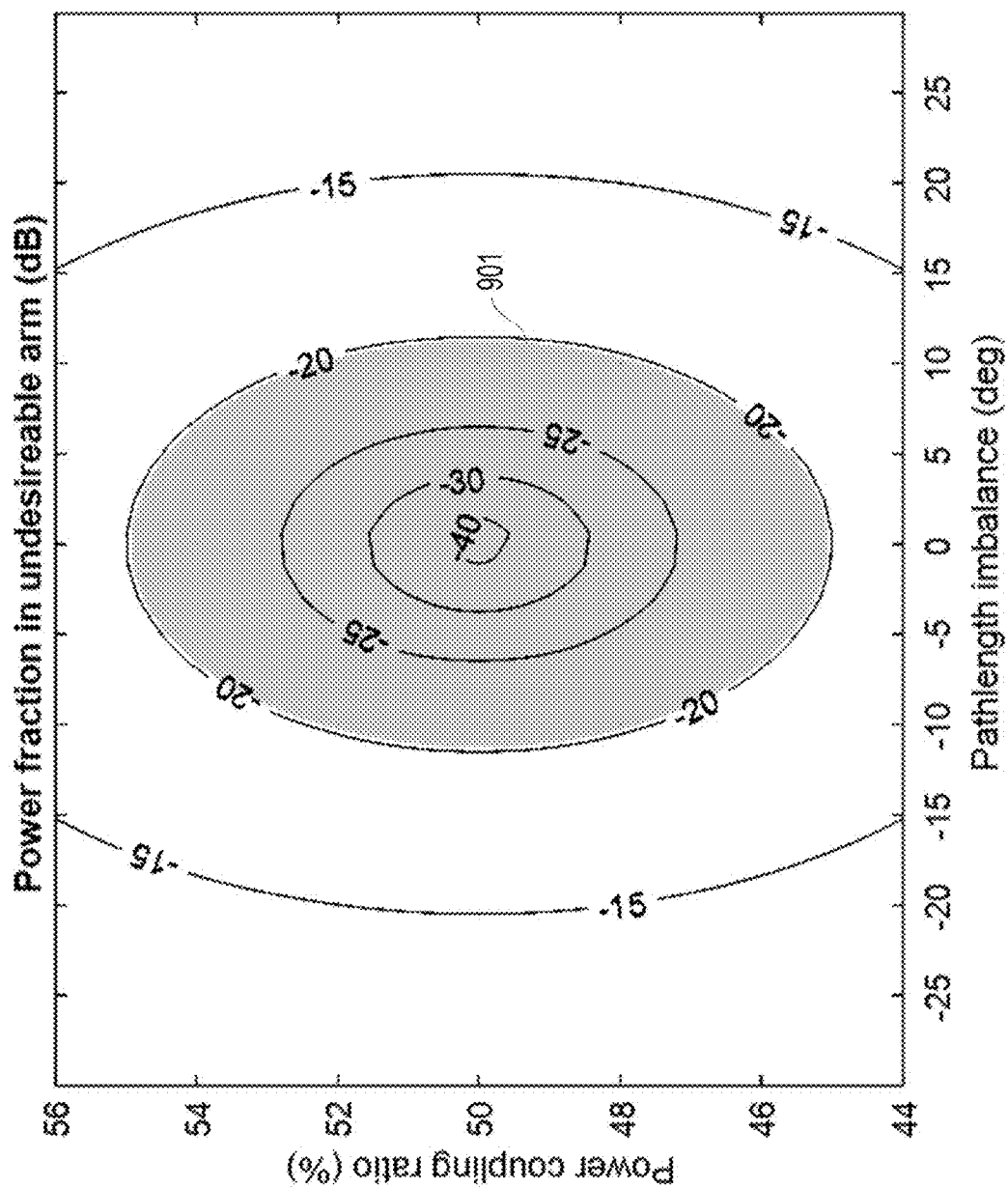
FIG. 9 is a contour map of a fraction of power transmitted into an unintended branch of an evanescent coupler configured for reversal of light direction according to an exemplary embodiment of the disclosure.

Refer now to the exemplary embodiment of FIG. 9, illustrating map of a fraction of power transmitted into an unintended waveguide (e.g., unintended branch) of an evanescent coupler configured with a reflector to reverse the direction of light, according to an exemplary embodiment of the disclosure. Optical power flowing backwards into an input waveguide, instead of flowing backwards into the output waveguide, is described as unintended power. The unintended power for a given coupler may be represented as a function of power coupling ratio and offset in optical path length in degrees.

In various embodiments, it is desirable for the power coupling to be as close as possible to about 50%, and it may be preferential that the reflector be positioned as close as possible to a direction normal to the direction of the waveguides, in order to avoid a path length imbalance between the incoming and outgoing waveguides. However, due to process variations, power coupling may differ from 50% and the reflector direction may differ from a direction normal to the direction of the waveguides, resulting in a small amount of light being coupled backwards into the incoming waveguide. Most applications may be able to tolerate unintended optical energy from imperfectly coupled light that returns to the incoming waveguide below −20 dB, i.e. power levels corresponding to the shaded region 901 of FIG. 9. This demonstrates the importance of accurate power coupling in evanescent couplers configured for reversal of light.

Having thus described several aspects and embodiments of the technology of this application, it is to be appreciated that various alterations, modifications, and improvements will readily occur to those of ordinary skill in the art. Such alterations, modifications, and improvements are intended to be within the spirit and scope of the technology described in the application. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, and/or methods described herein, if such features, systems, articles, materials, and/or methods are not mutually inconsistent, is included within the scope of the present disclosure.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

The phrase "and/or," as used herein in the specification and in the claims, should be understood to mean "either or both" of the elements so conjoined, i.e., elements that are conjunctively present in some cases and disjunctively present in other cases.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified.

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value.

In the claims, as well as in the specification above, all transitional phrases such as "comprising," "including," "carrying," "having," "containing," "involving," "holding," "composed of," and the like are to be understood to be open-ended, i.e., to mean including but not limited to. The transitional phrases "consisting of" and "consisting essentially of" shall be closed or semi-closed transitional phrases, respectively.

Where a range or list of values is provided, each intervening value between the upper and lower limits of that range or list of values is individually contemplated and is encompassed within the disclosure as if each value were specifically enumerated herein. In addition, smaller ranges between and including the upper and lower limits of a given range are contemplated and encompassed within the disclosure. The listing of exemplary values or ranges is not a disclaimer of other values or ranges between and including the upper and lower limits of a given range.

The use of headings and sections in the application is not meant to limit the disclosure; each section can apply to any aspect, embodiment, or feature of the disclosure. Only those claims which use the words "means for" are intended to be interpreted under 35 USC 112, sixth paragraph. Absent a recital of "means for" in the claims, such claims should not be construed under 35 USC 112. Limitations from the specification are not intended to be read into any claims, unless such limitations are expressly included in the claims.

Embodiments disclosed herein may be embodied as a system, method, apparatus, or computer program product. Accordingly, embodiments may take the form of an entirely mechanical embodiment, an entirely hardware embodiment, an entirely software embodiment (including firmware, resident software, micro-code, etc.), or an embodiment combining software and hardware aspects that may all generally be referred to herein as a "circuit," "module," or "system." Furthermore, embodiments may take the form of a computer program product embodied in one or more computer readable medium(s) having computer readable program code embodied thereon.

What is claimed is:

1. An optical coupler comprising:
two ridge waveguides comprising a first waveguide and a second waveguide, wherein one or more segments of the two waveguides are extended over a coupling length, wherein one or more sections of each ridge waveguide is at least partially defined by a set of cross-sectional profiles, a plurality of sections of each ridge waveguide have a width that tapers along a length of the two ridge waveguides,
wherein within the coupling length a subset of the set of cross-sectional profiles define a first pair of transition regions and a second pair of transition regions; and
a coupling region between the two ridge waveguides and spanning at least a section of the coupling length, wherein the first pair of transition regions are a first pair of steps, each of the first pair of steps defined by a first etch depth along an outer or inner surface of each ridge waveguide, wherein the second pair of transition regions are a second pair of steps, each of the second pair of steps defined by a second etch depth along an outer or inner surface of each of the first pair of steps.

2. The coupler of claim 1, wherein the second etch depth is deeper than the first etch depth.

3. The coupler of claim 1, wherein the first pair of transition regions and the second pair of transition regions are symmetrically arranged relative to a plane dividing the coupling region and oriented between the first waveguide and second waveguide.

4. The coupler of claim 1 further comprising:
a surface layer, the two waveguides extending above the surface layer;
a substrate; and
a confinement layer disposed below the two waveguides and above the substrate, wherein the two waveguides are spaced at a predetermined range from each other to couple evanescent waves from the first waveguide to the second waveguide over the coupling region.

5. The coupler of claim 4, wherein the first pair of transition regions and the second pair of transition regions are defined by one or more sections of the surface layer that extend outward from a side surface of each ridge waveguide.

6. The coupler of claim 1, further comprising a shared reflective surface disposed at an end of the coupling region, the shared reflective surface in optical communication with an end of each of the two waveguides and disposed at approximately normal angle to the two waveguides.

7. The coupler of claim 1, wherein a section of the two waveguides positioned before the coupling region is defined by an adiabatic transition that corresponds to a linear taper in curvature space.

8. The coupler of claim 6, wherein the width and curvature tapers along one or more sections of each waveguide such that the coupler has a power coupling that ranges between 40% to 60%.

9. The coupler of claim 1, wherein the two waveguides are configured to taper in each of their widths and a two-layer ridge evanescent coupler to transition to a one-layer ridge evanescent coupler, wherein a waveguide separation distance is specified by a fixed radius of curvature.

10. The coupler of claim 4, wherein the two waveguides comprise one or more of:
indium phosphide (InP); or
gallium arsenide (GaAs).

11. The coupler of claim 1, wherein a section of the two waveguides is configured to adiabatically modulate curvature of one or more layers of coupler as a gap between the two waveguides decreases.

12. The coupler of claim 6 further comprising:
an input port coupled to the first waveguide; and
an output port coupled to the second waveguide.

13. An evanescent coupler comprising:
two waveguides comprising an incoming waveguide and an outgoing waveguide, wherein the two waveguides are extended over a coupling length;
a coupling region between the two waveguides and spanning the coupling length, wherein the two waveguides are spaced at a predetermined range from each other to couple evanescent waves from the incoming waveguide to the outgoing waveguide over the coupling region, wherein the two waveguides adiabatically transition from a first elongate section comprising a pair of one-layer ridge waveguides to a second elongate section comprising a pair of two-layer ridge waveguides having a gap defined between a first layer of two layers of the two-layer ridge waveguides, wherein a side of each of the two-layer ridge waveguides is defined by a first step and a second step, wherein the first step is defined by the first layer of each of the two-layer ridge waveguides;

a surface layer for supporting the two waveguides;

a confinement layer for providing a vertical confinement of light for the two waveguides;

a shared reflector truncating the coupling region of the evanescent coupler at an angle approximately normal to the two waveguides; and a substrate, wherein the two waveguides are formed in or upon the substrate.

14. The evanescent coupler of claim 13,
wherein the reflector comprises an etched facet,
wherein the etched facet forms an angle with respect to a plane normal to the substrate, the angle being less than about 5 degrees, and
wherein the etched facet has a depth that ranges between about 2 to about 10 μm.

15. The evanescent coupler of claim 13,
wherein the reflector comprises a reflective coating, and
wherein the reflective coating comprises a layer of gold (Au) having a thickness that ranges between about 10 to about 2000 nm.

16. The evanescent coupler of claim 13, wherein the coupling region comprises one or more width tapers along a section of the two waveguides in the coupling region.

17. The evanescent coupler of claim 13, wherein power coupling between the two waveguides, from an edge of the evanescent coupler up to the reflector, ranges from about 46% to about 54%.

18. The evanescent coupler of claim 13, wherein the reflector comprises a plurality of dielectric materials forming a dielectric mirror.

19. The evanescent coupler of claim 13, wherein the two waveguides comprise one or more of:

silicon (Si);
indium phosphide (InP); or
gallium arsenide (GaAs).

20. A method for reversing a direction of light propagation in an evanescent coupler, the method comprising:

propagating light through an optical input of an evanescent coupler in optical communication with a first ridge waveguide;

transmitting the light through a plurality of sections of a first ridge waveguide, wherein one of the sections of the first ridge waveguide is separated from a second ridge waveguide by a gap such that an optical coupling length is defined, wherein one of the sections of the first ridge wave guide defines a first outer step and a second outer step, wherein one of the sections of the second ridge wave guide defines a first outer step and a second outer step;

transmitting the light along the optical coupling length, wherein the first ridge waveguide and the second ridge waveguide are spaced at a predetermined range from each other to couple evanescent waves from the first ridge waveguide to the second ridge waveguide over the coupling length to achieve about 40 to about 60% power coupling;

reflecting light from one or both of the first ridge waveguide and the second ridge waveguide at a single angled reflective surface that terminates the first ridge waveguide and the second ridge waveguide and is optically coupled therewith, wherein an angle of the angled reflective surface ranges from about 1 degrees to about 5 degrees;

continuing the evanescent coupling of the reflected light from the single angled reflective surface to achieve approximately 100% power coupling into the second ridge waveguide; and transmitting at least a portion of the reflected light from an optical output in optical communication with the second ridge waveguide.

21. The method of claim 20, wherein the light has a wavelength between about 1260 nm and about 1650 nm.

* * * * *

UNITED STATES PATENT AND TRADEMARK OFFICE
CERTIFICATE OF CORRECTION

| | | |
|---|---|---|
| PATENT NO. | : 12,360,312 B2 | Page 1 of 1 |
| APPLICATION NO. | : 17/965568 | |
| DATED | : July 15, 2025 | |
| INVENTOR(S) | : Tymon Barwicz | |

It is certified that error appears in the above-identified patent and that said Letters Patent is hereby corrected as shown below:

In the Claims

Under Column no. 16, Claim 20, Line no. 13, Replace:
"wave guide"
With:
--waveguide--

Under Column no. 16, Claim 20, Line no. 15, Replace:
"wave guide"
With:
--waveguide--

Signed and Sealed this
Sixteenth Day of September, 2025

Coke Morgan Stewart
*Acting Director of the United States Patent and Trademark Office*